US008804231B2

(12) United States Patent
Savchenkov et al.

(10) Patent No.: US 8,804,231 B2
(45) Date of Patent: Aug. 12, 2014

(54) STABILIZING RF OSCILLATOR BASED ON OPTICAL RESONATOR (75) Inventors: Anatoliy A. Savchenkov, Glendale, CA (US); Andrey B. Matsko, Pasadena, CA (US); Lute Maleki, Pasadena, CA (US); David Seidel, Alta Loma, CA (US); Vladimir S. Ilchenko, Arcadia, CA (US)

(73) Assignee: OEwaves, Inc., Pasadena, CA (US)

( * ) Notice: Subject to any disclaimer, the term of this patent is extended or adjusted under 35 U.S.C. 154(b) by 223 days.

(21) Appl. No.: 13/528,775

(22) Filed: Jun. 20, 2012

(65) Prior Publication Data
US 2012/0320449 A1 Dec. 20, 2012

Related U.S. Application Data (60) Provisional application No. 61/499,107, filed on Jun. 20, 2011.

(51) Int. Cl.
*H01S 3/13* (2006.01)
*H01S 3/10* (2006.01)
*G02B 6/293* (2006.01)

(52) U.S. Cl.
CPC ............. *H01S 3/1305* (2013.01); *H01S 3/1304* (2013.01); *H01S 3/10092* (2013.01); *G02B 6/29341* (2013.01)
USPC .......................................... 359/337.1; 372/32

(58) Field of Classification Search
CPC ............ G02B 6/29341; H01S 3/10092; H01S 3/1304; H01S 3/1305
See application file for complete search history.

(56) References Cited

U.S. PATENT DOCUMENTS

| 4,410,992 | A | * | 10/1983 | Javan | 372/32 |
| 4,724,314 | A | * | 2/1988 | Caimi | 250/205 |
| 4,807,999 | A | * | 2/1989 | Soo Hoo | 356/470 |
| 4,856,899 | A | * | 8/1989 | Iwaoka et al. | 356/454 |
| 5,014,278 | A | * | 5/1991 | Deki | 372/32 |
| 5,112,128 | A | * | 5/1992 | SooHoo et al. | 356/470 |
| 5,160,901 | A | | 11/1992 | Stone | |
| 5,204,640 | A | | 4/1993 | Logan, Jr. | |
| 5,220,292 | A | | 6/1993 | Bianchini et al. | |
| 5,383,210 | A | * | 1/1995 | Ichikawa | 372/29.021 |

(Continued)

FOREIGN PATENT DOCUMENTS

EP 0435125 A2 7/1991
WO WO-01/96936 A1 12/2001

(Continued)

OTHER PUBLICATIONS

Bay, Z., et al., "Measurement of an Optical Frequency and the Speed of Light," Phys. Rev. Lett, 29(3):189-192, Jul. 17, 1972.

(Continued)

*Primary Examiner* — Mark Hellner
*Assistant Examiner* — Ari M Diacou
(74) *Attorney, Agent, or Firm* — Perkins Coie LLP (57) ABSTRACT

Techniques, devices and systems that stabilize an RF oscillator by using an optical resonator that is stabilized relative to a master RF oscillator with acceptable frequency stability performance. In the examples described, the optical resonator is stabilized relative to the master RF oscillator by using a frequency stability indicator based on two different optical modes of the optical resonator. The RF oscillator to be stabilized is then locked to the stabilized optical resonator to achieve the acceptable RF stability in the RF oscillator.

25 Claims, 3 Drawing Sheets

(56) References Cited

U.S. PATENT DOCUMENTS

| | | | |
|---|---|---|---|
| 5,544,183 A * | 8/1996 | Takeda | 372/26 |
| 5,723,856 A | 3/1998 | Yao et al. | |
| 5,751,747 A | 5/1998 | Lutes et al. | |
| 5,777,778 A | 7/1998 | Yao | |
| 5,917,179 A | 6/1999 | Yao | |
| 5,929,430 A | 7/1999 | Yao et al. | |
| 5,985,166 A | 11/1999 | Unger et al. | |
| 6,080,586 A | 6/2000 | Baldeschwieler et al. | |
| 6,175,579 B1 | 1/2001 | Sandford et al. | |
| 6,178,036 B1 | 1/2001 | Yao | |
| 6,203,660 B1 | 3/2001 | Unger et al. | |
| 6,370,169 B1 * | 4/2002 | Imajuku et al. | 372/32 |
| 6,389,197 B1 | 5/2002 | Iltchenko et al. | |
| 6,417,957 B1 | 7/2002 | Yao | |
| 6,473,218 B1 | 10/2002 | Maleki et al. | |
| 6,476,959 B2 | 11/2002 | Yao | |
| 6,487,233 B2 | 11/2002 | Maleki et al. | |
| 6,488,861 B2 | 12/2002 | Iltchenko et al. | |
| 6,490,039 B2 | 12/2002 | Maleki et al. | |
| 6,535,328 B2 | 3/2003 | Yao | |
| 6,567,436 B1 | 5/2003 | Yao et al. | |
| 6,580,532 B1 | 6/2003 | Yao et al. | |
| 6,594,061 B2 | 7/2003 | Huang et al. | |
| 6,762,869 B2 | 7/2004 | Maleki et al. | |
| 6,795,481 B2 | 9/2004 | Maleki et al. | |
| 6,798,947 B2 | 9/2004 | Iltchenko | |
| 6,853,479 B1 | 2/2005 | Ilchenko et al. | |
| 6,871,025 B2 | 3/2005 | Maleki et al. | |
| 6,873,631 B2 | 3/2005 | Yao et al. | |
| 6,879,752 B1 | 4/2005 | Ilchenko et al. | |
| 6,901,189 B1 | 5/2005 | Savchenkov et al. | |
| 6,906,309 B2 | 6/2005 | Sayyah et al. | |
| 6,922,497 B1 | 7/2005 | Savchenkov et al. | |
| 6,928,091 B1 | 8/2005 | Maleki et al. | |
| 6,943,934 B1 | 9/2005 | Ilchenko et al. | |
| 6,987,914 B2 | 1/2006 | Savchenkov et al. | |
| 7,024,069 B2 | 4/2006 | Savchenkov et al. | |
| 7,043,117 B2 | 5/2006 | Matsko et al. | |
| 7,050,212 B2 | 5/2006 | Matsko et al. | |
| 7,061,335 B2 | 6/2006 | Maleki et al. | |
| 7,062,131 B2 | 6/2006 | Ilchenko | |
| 7,092,591 B2 | 8/2006 | Savchenkov et al. | |
| 7,133,180 B2 | 11/2006 | Ilchenko et al. | |
| 7,173,749 B2 | 2/2007 | Maleki et al. | |
| 7,184,451 B2 | 2/2007 | Ilchenko et al. | |
| 7,187,870 B2 * | 3/2007 | Ilchenko et al. | 398/161 |
| 7,218,662 B1 | 5/2007 | Ilchenko et al. | |
| 7,248,763 B1 | 7/2007 | Kossakovski et al. | |
| 7,260,279 B2 | 8/2007 | Gunn et al. | |
| 7,283,707 B1 | 10/2007 | Maleki et al. | |
| 7,356,214 B2 | 4/2008 | Ilchenko | |
| 7,362,927 B1 * | 4/2008 | Ilchenko et al. | 385/15 |
| 7,369,722 B2 | 5/2008 | Yilmaz et al. | |
| 7,389,053 B1 | 6/2008 | Ilchenko et al. | |
| 7,397,567 B2 * | 7/2008 | Kaertner et al. | 356/483 |
| 7,400,796 B1 | 7/2008 | Kossakovski et al. | |
| 7,440,651 B1 | 10/2008 | Savchenkov et al. | |
| 7,443,258 B2 | 10/2008 | Hagelin | |
| 7,460,746 B2 | 12/2008 | Maleki et al. | |
| 7,480,425 B2 | 1/2009 | Gunn et al. | |
| 7,583,711 B2 * | 9/2009 | Tiemann | 372/29.011 |
| 7,587,144 B2 | 9/2009 | Ilchenko et al. | |
| 7,630,417 B1 * | 12/2009 | Maleki et al. | 372/20 |
| 7,634,201 B2 | 12/2009 | Maleki et al. | |
| 7,801,189 B2 * | 9/2010 | Maleki et al. | 372/26 |
| 7,813,651 B2 | 10/2010 | Ilchenko et al. | |
| 7,869,472 B2 | 1/2011 | Maleki et al. | |
| 7,929,589 B1 | 4/2011 | Ilchenko et al. | |
| 7,965,745 B2 | 6/2011 | Maleki et al. | |
| 7,991,025 B2 | 8/2011 | Maleki et al. | |
| 8,089,684 B1 | 1/2012 | Koonath et al. | |
| 8,094,359 B1 | 1/2012 | Matsko et al. | |
| 8,102,597 B1 | 1/2012 | Maleki et al. | |
| 8,111,722 B1 | 2/2012 | Maleki et al. | |
| 8,155,913 B2 | 4/2012 | Eliyahu et al. | |
| 8,155,914 B2 | 4/2012 | Eliyahu et al. | |
| 8,159,736 B2 | 4/2012 | Maleki et al. | |
| 8,417,076 B2 * | 4/2013 | Maleki et al. | 385/30 |
| 2001/0038651 A1 | 11/2001 | Maleki et al. | |
| 2002/0018611 A1 | 2/2002 | Maleki et al. | |
| 2002/0018617 A1 | 2/2002 | Iltchenko et al. | |
| 2002/0021765 A1 | 2/2002 | Maleki et al. | |
| 2002/0081055 A1 | 6/2002 | Painter et al. | |
| 2002/0085266 A1 | 7/2002 | Yao | |
| 2002/0097401 A1 | 7/2002 | Maleki et al. | |
| 2003/0160148 A1 | 8/2003 | Yao et al. | |
| 2003/0179785 A1 * | 9/2003 | Kane | 372/10 |
| 2004/0100675 A1 | 5/2004 | Matsko et al. | |
| 2004/0109217 A1 | 6/2004 | Maleki et al. | |
| 2004/0218880 A1 | 11/2004 | Matsko et al. | |
| 2004/0240781 A1 | 12/2004 | Savchenkov et al. | |
| 2004/0263268 A1 | 12/2004 | Ivanov et al. | |
| 2005/0017816 A1 | 1/2005 | Ilchenko et al. | |
| 2005/0063034 A1 | 3/2005 | Maleki et al. | |
| 2005/0074200 A1 | 4/2005 | Savchenkov et al. | |
| 2005/0123306 A1 * | 6/2005 | Ilchenko et al. | 398/161 |
| 2005/0128566 A1 | 6/2005 | Savchenkov et al. | |
| 2005/0175358 A1 | 8/2005 | Ilchenko et al. | |
| 2005/0248823 A1 | 11/2005 | Maleki et al. | |
| 2007/0009205 A1 * | 1/2007 | Maleki et al. | 385/27 |
| 2007/0153289 A1 | 7/2007 | Yilmaz et al. | |
| 2007/0217456 A1 * | 9/2007 | Tiemann | 372/32 |
| 2008/0001062 A1 | 1/2008 | Gunn et al. | |
| 2008/0075464 A1 | 3/2008 | Maleki et al. | |
| 2008/0310463 A1 | 12/2008 | Maleki et al. | |
| 2009/0097516 A1 | 4/2009 | Maleki et al. | |
| 2009/0135860 A1 * | 5/2009 | Maleki et al. | 372/20 |
| 2009/0208205 A1 | 8/2009 | Eliyahu et al. | |
| 2009/0251705 A1 | 10/2009 | Le et al. | |
| 2009/0310629 A1 | 12/2009 | Maleki et al. | |
| 2009/0324251 A1 | 12/2009 | Ilchenko et al. | |
| 2010/0118375 A1 * | 5/2010 | Maleki et al. | 359/239 |
| 2010/0284430 A1 * | 11/2010 | Lasri et al. | 372/18 |
| 2011/0110387 A1 | 5/2011 | Maleki et al. | |
| 2011/0150485 A1 | 6/2011 | Seidel et al. | |
| 2011/0255094 A1 | 10/2011 | Mohageg et al. | |
| 2012/0039346 A1 | 2/2012 | Liang et al. | |

FOREIGN PATENT DOCUMENTS

| | | | |
|---|---|---|---|
| WO | WO-2005/038513 A2 | 4/2005 | |
| WO | WO-2005/055412 A2 | 6/2005 | |
| WO | WO-2005/067690 A2 | 7/2005 | |
| WO | WO-2005/122346 A2 | 12/2005 | |
| WO | WO-2006/076585 A2 | 7/2006 | |
| WO | WO-2007/143627 A2 | 12/2007 | |

OTHER PUBLICATIONS

DeVoe, R.G., et al., "Laser frequency division and stabilization," Phys. Rev. A, 30(5):2827-2829, Nov. 1984.

Ye, J., et al., "Applications of optical cavities in modern atomic, molecular, and optical physics," Adv. Atom. Mol. Opt. Phys., 49:1-83, 2003.

Hall, J.L., et al., "History of optical comb development" in "Femtosecond optical frequency comb: Principle, operation, and applications," edited by J. Ye and S. T. Cundiff, 1-48, Springer, 2004.

Dreyer, R.W.P., et al., "Laser phase and frequency stabilization using an optical resonator," Appl. Phys. B, 31:97-105, Feb. 1983.

Salomon, Ch., et al., "Laser stabilization at the millihertz level," J. Opt. Soc. Am. B, 5(8):1576-1587, Aug. 1988.

Woode, R.A., et al., "An ultralow noise microwave oscillator based on a high-Q liquidnitrogen cooled sapphire resonator," IEEE Trans. Ultrason. Ferroelec. Freq. Contr., 43(5):936-941, Sep. 1996.

Alnis, J., et al., "Thermal-noise-limited crystalline whispering-gallery-mode resonator for laser stabilization," Phys. Rev. A, 011804-1-011804-4, Jul. 2011.

Maleki, L., et al., "All-optical integrated rubidium atomic clock," Proceedings of the 2011 Joint Conference of the IEEE International Frequency Control and the European Frequency and Time Forum, 799-803, 2011.

(56) References Cited

OTHER PUBLICATIONS

Del'Haye, P., et al., "Full stabilization of a microresonator-based optical frequency comb," Phys. Rev. Lett., 101:053903-1-053903-4, Aug. 2008.

Carmon, Tal, et al., "Dynamical thermal behavior and thermal selfstability of microcavities," Opt. Express, 12(20):4742-4750, Oct. 2004.

Walls, F.L., et al., "Fundmental limits on the frequency stabilities of crystal oscillators," IEEE Trans. Ultrason. Ferroelec. Freq. Contr., 42(4):576-589, Jul. 1995.

Savchenkov, A.A., et al., "Whispering-gallery-mode resonators as frequency references.II.stabilization," J. Opt. Soc. Am. B, 24(12):2988-2997, Dec. 2007.

Matsko, A.B., et al., "Self-referenced stabilization of temperature of an optomechanical microresonator," Phys. Rev. A, 83:021801-1-021801-4, Feb. 2011.

Strekalov, D. V., et al., "Temperature measurement and stabilization in a birefringent whispering gallery mode resonator," Opt. Express, 19(15):14495-14501, Jul. 2011.

Braginsky, V.B., et al., "Quality-Factor and Nonlinear Properties of Optical Whispering-Gallery Modes," Physics Letters A, 137(7, 8):393-397, May 1989.

Eliyahu, D., et al., "Low Phase Noise and Spurious Levels in Multi-Loop Opto-Electronic Oscillators," Proceedings of the 2003 IEEE International Frequency Control Sympsoium and PDA Exhibition, pp. 405-410, May 2003.

Eliyahu, D., et al., "Modulation Response ($S_{21}$) of the Coupled Opto-Electronic Oscillator," Proceedings of the 2005 IEEE International Frequency Control Symposium and Exposition, pp. 850-856, Aug. 2005.

Eliyahu, D., et al., "Tunable, Ultra-Low Phase Noise YIG Based Opto-Electronic Oscillator," IEEE MTT-S International Microwave Symposium Digest, 3:2185-2187, Jun. 2003.

Gorodetsky, M.L., et al., "Optical Microsphere Resonators: Optimal Coupling to High-$Q$ Whispering-Gallery Modes," J.Opt. Soc. Am. B, 16(1):147-154, Jan. 1999.

Gorodetsky, M.L., et al., "Rayleigh Scattering in High-$Q$ Microspheres," J. Opt. Soc. Am. B, 17(6):1051-1057, Jun. 2000.

Gorodetsky, M.L., et al., "Ultimate $Q$ of Optical Microsphere Resonators," Optics Letters, 21(7):453-455, Apr. 1996.

Hryniewicz, J.V., et al., "Higher Order Filter Response in Coupled Microring Resonators," IEEE Photonics Technology Letters, 12(3):320-322, Mar. 2000.

Huang, S., et al., "A 'Turnkey' Optoelectronic Oscillator with Low Acceleration Sensitivity," 2000 IEEE/EIA International Frequency Control Symposium and Exhibition, pp. 269-279, Jun. 2000.

Ilchenko, V., et al., "Electrooptically Tunable Photonic Microresonators and Photonic Bandgap Waveguide Coupling for Micro-Optoelectronic Oscillators," GOMACTech 2003, Tampa, Florida, pp. 1-4.

Ilchenko, V., et al., "High-Q Microsphere Cavity for Laser Stabilization and Optoelectronic Microwave Oscillator," Proceedings SPIE Microresonators and Whispering-Gallery Modes, vol. 3611, pp. 190-198, Jan. 1999.

Ilchenko, V., et al., "Microsphere Integration in Active and Passive Photonics Devices," Proc. of SPIE Laser Resonators III, vol. 3930, pp. 154-162, Jan. 2000.

Ilchenko, V., et al., "Microtorus: A High-Finesse Microcavity with Whispering-Gallery Modes," Optics Letters, 26(5):256-258, Mar. 2001.

Ilchenko, V., et al., "Pigtailing the High-$Q$ Microsphere Cavity: A Simple Fiber Coupler for Optical Whispering-Gallery Modes," Optics Letters, 24(11):723-725, Jun. 1999.

Ilchenko, V., et al., "Sub-Micro Watt Photonic Microwave Receiver," IEEE Photonics Technology Letters, 14(11):1602-1604, Nov. 2002.

Ilchenko, V., et al., "Tunability and Synthetic Lineshapes in High-Q Optical Whispering Gallery Modes," Proc. of SPIE Laser Resonators and Beam Control VI, vol. 4969, pp. 195-206, Jan. 2003.

Ilchenko, V., et al., "Whispering-Gallery-Mode Electro-Optic Modulator and Photonic Microwave Receiver," J. Opt. Soc. Am. B, 20(2):333-342, Feb. 2003.

Ito, H., et al., "InP/InGaAs Uni-Travelling-Carrier Photodiode with 310 GHz Bandwidth," Electronics Letters, 36(21):1809-1810, Oct. 2000.

Logan, R., et al., "Stabilization of Oscillator Phase Using a Fiber-Optic Delay-Line," IEEE 45th Annual Symposium on Frequency Control, pp. 508-512, May 1991.

Maleki, L., "The Opto-Electronic Oscillator: Prospects for Extending the State of the Art in Reference Frequency Generation," International Topical Meeting on Microwave Photonics, pp. 195-198, Oct. 1998.

Matsko, A., et al., "Active Mode Locking with Whispering-Gallery Modes," J. Opt. Soc. Am. B, 20(11):2292-2296, Nov. 2003.

Matsko, A., et al., "Whispering-Gallery-Mode based Optoelectronic Microwave Oscillator," Journal of Modern Optics, 50(15-17):2523-2542, Feb. 2004.

Matsko, A., et al., "Whispering-Gallery-Mode Resonators as Frequency References. I. Fundamental Limitations," J. Opt. Soc. Am. B, 24(6):1324-1335, Jun. 2007.

Myers, L.E., et al., "Quasi-Phase-Matched Optical Parametric Oscillators in Bulk Periodically Poled $LiNbO_3$," J. Opt. Soc. Am. B, 12(11):2102-2116, Nov. 1995.

Savchenkov, A., et al., "RF photonic signal processing components: From high order tunable filters to high stability tunable oscillators," IEEE Radar Conference, pp. 1-6, May 2009.

Savchenkov, A., et al., "Tunable Resonant Single-Sideband Electro-Optical Modulator," Digest of the IEEE/LEOS Summer Topical Meetings, pp. 63-64, Jul. 2009.

Savchenkov, A., et al., "Whispering-Gallery-Mode Resonators as Frequency References. II. Stabilization," J. Opt. Soc. Am. B, 24(12): 2988-2997, Dec. 2007.

Vassiliev, V.V., et al., "Narrow-Line-Width Diode Laser with a High-$Q$ Microsphere Resonator," Optics Communications, 158(1-6):305-312, Dec. 1998.

Yao, X.S., et al., "A Novel Photonic Oscillator," Digest of the LEOS Summer Topical Meetings, pp. 17-18, Aug. 1995.

Yao, X.S., et al., "A Novel Photonic Oscillator," TDA Progress Report 42-122, pp. 32-43, Aug. 1995.

Yao, X.S., et al., "Converting Light into Spectrally Pure Microwave Oscillation," Optics Letters, 21(7):483-485, Apr. 1996.

Yao, X.S., et al., "Coupled Optoelectronic Oscillators for Generating Both RF Signal and Optical Pulses," Journal of Lightwave Tecnhology, 18(1):73-78, Jan. 2000.

Yao, X.S., et al., "Dual Microwave and Optical Oscillator," Optics Letters, 22(24):1867-1869, Dec. 1997.

Yao, X.S., et al., "Multiloop Optoelectronic Oscillator," IEEE Journal of Quantum Electronics, 36(1):79-84, Jan. 2000.

Yao, X.S., et al., "Optoelectronic Microwave Oscillator," J. Opt. Soc. Am. B, 13(8):1725-1735, Aug. 1996.

Yao, X.S., et al., "Optoelectronic Oscillator for Photonic Systems," IEEE Journal of Quantum Electronics, 32(7):1141-1149, Jul. 1996.

Yu, J., et al., "Compact Optoelectronic Oscillator with Ultra-Low Phase Noise Performance," Electronics Letters, 35(18):1554-1555, Sep. 1999.

\* cited by examiner

STABILIZING RF OSCILLATOR BASED ON OPTICAL RESONATOR

CROSS-REFERENCES TO RELATED APPLICATIONS

This patent document claims the benefit of U.S. Provisional Application No. 61/499,107 entitled "Method for stabilization of an RF oscillator using a resonant opto-electronic feedback loop" and filed Jun. 20, 2011, the disclosure of which is incorporated by reference as part of the specification of this document.

BACKGROUND

This document relates to radio frequency (RF) oscillators, including stabilization of RF oscillators.

Stable RF oscillators are widely used in communications, electronics and other devices or systems. Low noise and stability of RF oscillators are highly desirable. Complex stabilization circuitry and use of external reference units for providing an absolute frequency reference, e.g., atomic cells, are required in various stabilized electronic oscillators.

SUMMARY

This document describes techniques, devices and systems that stabilize an RF oscillator by using an optical resonator that is stabilized relative to a master RF oscillator with acceptable frequency stability performance. The master RF oscillator can be an RF oscillator made of RF electronic components or an opto-electronic oscillator made of one or more opto-electronic oscillation loops. Alternatively, the master RF oscillator can be replaced by an optical oscillator. In the examples described here, the optical resonator is stabilized relative to the master RF oscillator by using a frequency stability indicator based on two different optical modes of the optical resonator. The RF oscillator to be stabilized is then locked to the stabilized optical resonator to achieve the acceptable RF stability in the RF oscillator.

In one implementation, a system is provided for stabilizing a radio frequency (RF) oscillator with respect to an optical resonator and includes a laser that produces laser light, and an optical resonator that is an optical whispering gallery mode resonator supporting a first family of first optical modes and a second, different family of second optical modes. The optical resonator is structured so that an optical mode in the first family and an optical mode in the second family exhibit different susceptibilities to one or more external conditions of the optical resonator. This system includes an optical coupler that couples the laser light into the optical resonator so the laser light inside the optical resonator is at a selected first optical mode in the first family at a first optical frequency and a selected second optical mode in the second family at a second, different optical frequency. The frequency difference between the first optical frequency of the selected first optical mode and the selected second optical mode at the second optical frequency indicates a stability of the optical resonator with respect to the one or more external conditions. A photodetector is coupled to receive an optical signal from the optical resonator that contains light in the selected first and second optical modes and produces a detector signal that represents a change in the frequency difference between the first optical frequency and the second optical frequency. A master RF oscillator is provided and produces a stable master RF oscillation signal which is coupled to cause a first optical modulation in the laser light inside the optical resonator. This system includes a first locking circuit coupled to receive the RF oscillation signal from the master RF oscillator and the detector signal from the photodetector and operable to control the optical resonator, based on the first optical modulation, to reduce the monitored change in the frequency difference between the first optical frequency and the second optical frequency and to stabilize the optical resonator with respect to the master RF oscillator. An RF oscillator is provided and produces an RF oscillation signal which is coupled to cause a second optical modulation in the laser light inside the optical resonator; and a second locking circuit is coupled between the RF oscillator and the optical resonator and operable to control, based on the second optical modulation, the RF oscillator to stabilize the RF oscillator relative to the optical resonator.

In another implementation, a system for stabilizing an RF oscillator of interest via an optical resonator locked to a master oscillator can include a laser that produces laser light; and an optical resonator that is structured to support a first family of first optical modes and a second, different family of second optical modes, an optical mode in the first family and an optical mode in the second family exhibiting different susceptibilities to one or more external conditions of the optical resonator. The optical resonator is optically coupled to receive the laser light from the laser and to support the laser light inside the optical resonator at a selected first optical mode in the first family at a first optical frequency and a selected second optical mode in the second family at a second, different optical frequency. The frequency difference between the first optical frequency of the selected first optical mode and the selected second optical mode at the second optical frequency indicates a stability of the optical resonator with respect to the one or more external conditions. A photodetector is coupled to receive an optical signal from the optical resonator that contains light in the selected first and second optical modes and produces a detector signal that represents a change in the frequency difference between the first optical frequency and the second optical frequency. A master oscillator is provided and produces a stable master oscillation signal. An RF oscillator is provided and produces an RF oscillation signal. This system includes a first locking circuit coupled between the master oscillator and the optical resonator and operable to control the optical resonator to reduce the monitored change in the frequency difference between the first optical frequency and the second optical frequency and to stabilize the optical resonator with respect to the master oscillator; and a second locking circuit coupled between the RF oscillator and the optical resonator and operable to control the RF oscillator to stabilize the RF oscillator relative to the optical resonator to lock an RF frequency of the RF oscillator with respect to the master oscillator via the optical resonator. The master oscillator can be an optical oscillator or an RF oscillator in different implementations.

In yet another implementation, a method is provided for stabilizing an RF oscillator of interest via an optical resonator stabilized to a master RF oscillator. This method includes providing an optical resonator that is structured to support a first family of first optical modes and a second, different family of second optical modes, an optical mode in the first family and an optical mode in the second family exhibiting different susceptibilities to one or more external conditions of the optical resonator; selecting a first optical mode in the first family at a first optical frequency and a second optical mode in the second family at a second, different optical frequency to generate a frequency difference between the first optical frequency of the selected first optical mode and the selected second optical mode at the second optical frequency as an indicator of a stability of the optical resonator with respect to the one or more external conditions; monitoring an optical signal from the optical resonator that represents a change in the frequency difference between the first optical frequency and the second optical frequency; stabilizing the optical resonator to reduce the monitored change in the frequency difference between the first optical frequency and the second optical frequency to stabilize the optical resonator with respect to a master RF frequency from a master RF oscillator; and using information in the optical signal from the optical resonator to operate a locking circuit of an RF oscillator to lock an RF frequency of the RF oscillator of interest with respect to the optical resonator so that the RF oscillator of interest is stabilized relative to the master RF oscillator via the optical resonator.

These and other implementations and features are described in greater in detail in the detailed description, the drawings and the claims.

DETAILED DESCRIPTION

RF oscillators can be built by RF electronic components or as hybrid devices or systems that include both RF electronic components and optical components. Opto-electronic oscillators ("OEOs") described in U.S. Pat. Nos. 5,723,856, 5,777,778, 5,929,430, and 6,567,436 are examples of such hybrid devices that produce RF oscillations. Such an OEO can include an electrically controllable optical modulator and at least one active opto-electronic feedback loop that includes an optical part and an electrical part interconnected by a photodetector. The opto-electronic feedback loop receives the modulated optical output from the modulator and converted the modulated optical output into an electrical signal which is applied to control the modulator. The feedback loop produces a desired long delay in the optical part of the loop to suppress phase noise and feeds the converted electrical signal in phase to the modulator to generate the optical modulation and generate and sustain an electrical oscillation in RF or microwave frequencies when the total loop gain of the active opto-electronic loop and any other additional feedback loops exceeds the total loss. Such an opto-electronic loop is an active, in-phase loop that oscillates and thus is different from the conventional feedback loop that stabilizes a device at a particular stable operating condition or state. The generated oscillating signals are tunable in frequency and can have narrow spectral linewidths and low phase noise in comparison with the signals produced by other RF and microwaves oscillators.

The present techniques, devices and systems that stabilize an RF oscillator by using an optical resonator are based on electronic-optical hybrid designs that use the optical resonator to provide stability transfer among optical modes of the optical resonator (e.g., a monolithic optical microresonator) for long term frequency stabilization of the RF oscillator. Locking the frequency difference of two microresonator modes with dissimilar sensitivity to an applied forcing function to a master optical oscillator or a master RF oscillator improves the long term stability of a slave RF oscillator locked to the frequency difference of another pair of modes with nearly identical sensitivity to the same forcing function. For instance, the stability of a 10 MHz master oscillator with Allan deviation of $10^{-7}$ at $10^3$ s can be improved and transferred to a slave oscillator with identical free running stability performance, so that the resultant Allan deviation of the slave oscillator becomes equal to $10^{-13}$ at $10^3$ s. In some implementations of the described RF stabilization technology, an absolute frequency reference may be eliminated by using the optical resonator and the master RF oscillator.

Optical resonators can spatially confine resonant optical energy in a limited cavity with a low optical loss. The resonance of an optical resonator can provide various useful functions such as optical frequency references, optical filtering, optical modulation, optical amplification, optical delay, and others. Light can be coupled into or out of optical resonators via various coupling mechanisms according to the configurations of the resonators. For example, Fabry-Perot optical resonators with two reflectors at two terminals may use partial optical transmission of at least one reflector to receive or export light. Optical whispering gallery mode (WGM) resonators confine light in a whispering gallery mode that is totally reflected within a closed circular optical path. Unlike Fabry-Perot resonators, light in WGM resonators cannot exit the resonators by optical transmission. Light in a WGM resonator "leaks" out of the exterior surface of the closed circular optical path of a WGM resonator via the evanescence field of the WGM mode. An optical coupler can be used to couple light into or out of the WGM resonator via this evanescent field. Optical WGM resonators can be monolithically integrated on a substrate in various configurations, e.g., an optical WGM resonator may be integrated on a planar semiconductor structure. Other optical resonators, such as optical ring resonators, may also be used for the stabilization systems described in this document. For example, a monolithic ring resonator formed on a substrate can be used as the optical resonator with respect to which the RF oscillator is stabilized.

One technical challenge associated with using optical resonators as frequency references is stabilization of a resonance of an optical resonator against drifts and fluctuations of the resonance caused by various factors because the resonator is subject to internal changes and external perturbations. For compact optical resonators, including optical whispering gallery mode resonators with a dimension on the order of millimeters or less (e.g., $10 \sim 10^2$ microns), it is difficult to stabilize the optical resonators and their resonances.

The stabilization of an RF oscillator in the examples of this document uses an RF photonic transformer having an optical microresonator with at least two families of modes with different sensitivity to an applied forcing function. An optical resonator can be used as a translation link between optical frequency and RF frequency based on the relationship between the optical frequency $\omega_0$ and the free spectral range (FSR) frequency $\omega_{FSR}$, given as $$\omega_0 = l\omega_{FSR} + \Delta\omega \quad (1)$$

where l is an integer number and $\Delta\omega$ is the frequency shift arising due to the dispersive phase shift correction within the resonator. The modes of the resonator serve as a link between the RF and the optical frequency. This relationship can be used to provide an accurate translation of a known RF frequency, precisely defined by an RF clock, to the optical frequency domain. The practical implementation of this translation can be difficult due to the requirement of having the accurate knowledge of the parameter $\Delta\omega$, which is related to the dispersion associated with the resonator structure, such as the mirror coatings.

While optical resonators are not particularly suitable for absolute frequency metrology, they can be useful for stabilization of devices such as lasers and RF oscillators because an absolute frequency reference is not a prerequisite for long term frequency stabilization of an oscillator. The use of two families of optical modes with different properties are used for achieving long term stabilization of an RF oscillator and improving the efficiency of stability transformation by several orders of magnitude.

The examples described below provide a method for stabilizing a radio frequency (RF) oscillator with respect to an optical resonator. This method includes providing an optical resonator that is structured to support a first family of first optical modes and a second, different family of second optical modes where an optical mode in the first family and an optical mode in the second family exhibits different susceptibilities to one or more external conditions of the optical resonator. A first optical mode in the first family at a first optical frequency and a second optical mode in the second family at a second, different optical frequency are selected to generate a frequency difference between the first optical frequency of the selected first optical mode and the selected second optical mode at the second optical frequency as an indicator of a stability of the optical resonator with respect to the one or more external conditions. An optical signal from the optical resonator that represents a change in the frequency difference between the first optical frequency and the second optical frequency is monitored. The optical resonator is stabilized with respect to a master RF frequency from a master RF oscillator to reduce the monitored change in the frequency difference between the first optical frequency and the second optical frequency. This method further uses information in the optical signal from the optical resonator to operate a locking circuit of an RF oscillator to lock an RF frequency of the RF oscillator with respect to the optical resonator so that the RF oscillator is stabilized relative to the master RF oscillator via the optical resonator. In implementations, a laser can be used to direct laser light into one mode of the optical resonator and the laser light inside the optical resonator is modulated to produce an optical harmonic to be coupled to the selected second optical mode of the optical resonator. The modulated light of the selected first optical mode and the selected second optical mode can be coupled out of the optical resonator as the optical signal that is received by a photodetector which produces a detector signal containing information on the frequency difference. The detector signal is then used to lock the optical resonator to the master RF oscillator.

Figure 1:
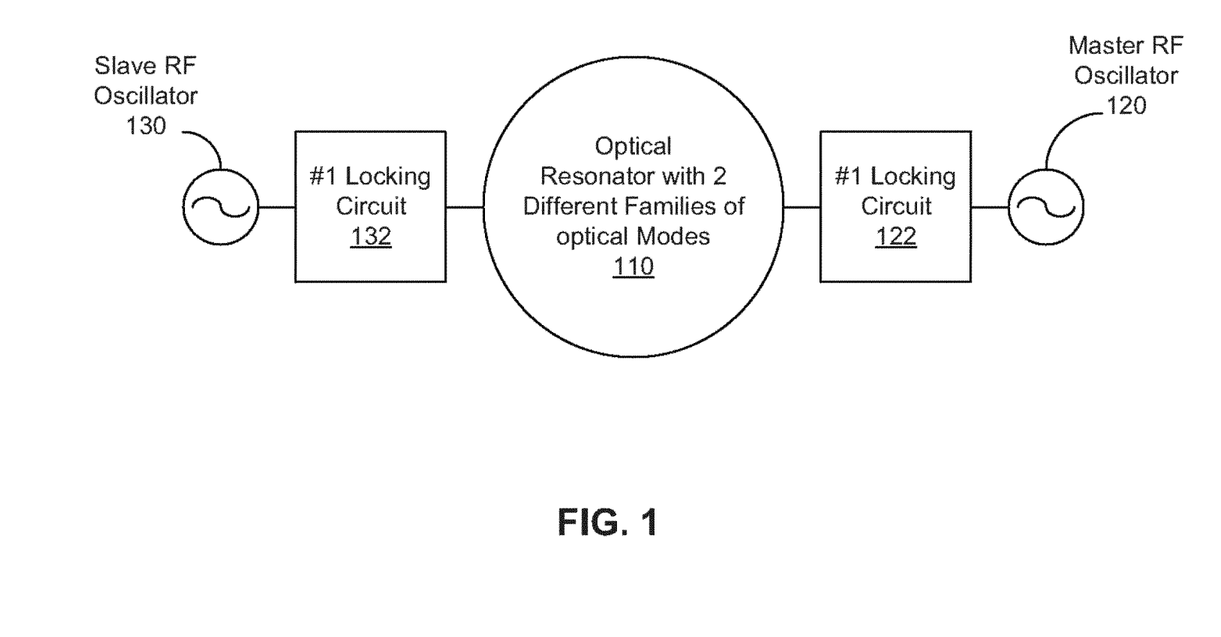
FIG. 1 shows an example of a system for locking an RF oscillator to an optical resonator that is further locked to a master RF oscillator.

FIG. 1 shows an example of a system based on the above stabilization approach. An optical resonator 110 with two different families of modes can be a resonator 110 formed of an optical birefringent material that supports ordinary and extraordinary waves in the resonator 110. An optical mode in the first family and an optical mode in the second family exhibits different susceptibilities to one or more external conditions of the optical resonator, e.g., the dependence of the refractive index in response to a change in temperature or external pressure. Within the same family of optical modes, two different optical modes tend to exhibit same or similar susceptibilities to the one or more external conditions and thus are stable relative to each other in frequency as the temperature or other parameters change. A first locking circuit 122 is shown to lock the resonator 110 relative to the master RF oscillator 120 based on the frequency difference between the first optical frequency of the selected first optical mode and the selected second optical mode at the second optical frequency as an indicator of a stability of the optical resonator 110. A second locking circuit 132 is shown to lock the slave RF oscillator 130 to the optical resonator 110. For example, the second locking circuit 132 can use a frequency difference between two different optical modes within the same family of modes (the first family or the second family) as a stable frequency reference to lock the output RF frequency of the salve oscillator 130 to the optical resonator 110. The master RF oscillator 120 can be an RF oscillator made of RF electronic components or an opto-electronic oscillator made of one or more opto-electronic oscillation loops. Alternatively, the master RF oscillator can be replaced by an optical oscillator with respect to which the optical resonator 110 is stabilized.

The microresonator-based RF photonic frequency stability transformer uses two families of optical modes with significantly different susceptibility to external conditions such as mechanical pressure, voltage, and temperature. Some implementations select two optical modes, each of which belongs to one of the two mode families, and lock the frequency difference between those modes to a master RF oscillator. The locking can be implemented in various ways. For instance, assuming that light emitted by a cw laser is modulated with an RF signal, the carrier of the modulated light is locked to the center of one of the optical modes using a suitable locking mechanism, e.g., a frequency locking based on the well-known Pound-Drever-Hall technique. The external parameter(s) can be adjusted via an electronic feedback so that the second selected optical mode has a frequency equal to the frequency of the modulation sideband. The stability of the microresonator spectrum becomes dependent on the stability of the master RF oscillator.

It is assumed that the laser frequency ($\omega_0$) can be adjusted or tuned to follow the corresponding optical mode. The locking of the modulation sideband and the other selected resonator mode ($\omega_1$) is realized via feedback to uncorrelated environmental (or applied) parameters $q_j$ that change the frequency of both resonator modes. The drift of these optical frequencies can be expressed as $$\Delta\omega_i = \sum_j \alpha_{i,j} \Delta q_j + \delta\omega_i. \tag{2}$$

where $i=0; 1$, $\alpha_{ij}$ are scaling parameters, and $\Delta q_j$ is the residual drift of the corresponding environmental or applied parameters. Considerations have been given to the facts that frequencies of the carrier and the modulation sideband depend on the imperfection of the electronic lock, characterized via unknown detunings between the frequencies of the optical harmonics and the resonator modes ($\delta\omega i$). The frequency difference between the carrier and the modulation sideband is given by $$\Delta\omega_0 \Delta\omega_1 = \delta\omega_{RF}. \tag{3}$$

where $\delta\omega_{RF}$ is the residual frequency drift of the master oscillator. The goal of the procedure is to minimize either $<(\Delta\omega_0)^2>$ or $<(\Delta\omega_1)^2>$ quadratic deviation under Eq. (3).

An explicit solution exists if only one environmental (or applied) parameter, e.g., the temperature of the resonator $T(q_1 \equiv T)$, is important. This situation is applicable to various practical applications where the drift of the ambient temperature tends to cause the frequency drift of the oscillator locked to the microresonator. Eq. (3) suggests that the residual temperature drift given by the locking circuit is $\Delta T=(\delta\omega_{RF}-\delta\omega_0\delta\omega_1)/(\alpha_{0,T}-\alpha_{1,T})$, and the stability of the optical harmonics is $$\Delta\omega_i = \frac{\alpha_{1,T}}{\alpha_{0,T}-\alpha_{1,T}}(\delta\omega_{RF}-\delta\omega_0+\delta\omega_1)+\delta\omega_i. \quad (4)$$

Notably, when $\alpha_{0;T}$ and $\alpha_{1,T}$ are significantly different, the stability of the optical harmonics is given by the stability of the RF master oscillator, $\langle(\Delta\omega_i)^2\rangle \sim \langle(\delta\omega_{RF})^2\rangle$. Therefore, the present technique allows transfer of the stability of an RF oscillator to the optical domain in such a way that the relative stability of the laser locked to the resonator becomes much larger than the stability of the RF master oscillator.

The efficiency of the described stabilization technique can be estimated as follows. Consider a freely suspended $MgF_2$ whispering-gallerymode (WGM) microresonator under the assumptions that $\omega_0$ ($\omega_1$) is the frequency of its ordinarily (extraordinarily) polarized mode and $\delta\omega_0$ and $\delta\omega_1$ are negligible, so that $$\alpha_{0,T} = -\frac{1}{n_o}\frac{\partial n_o}{\partial T} - \frac{1}{R}\frac{\partial R}{\partial T} \quad (5)$$

$$\alpha_{1,T} = -\frac{1}{n_e}\frac{\partial n_e}{\partial T} - \frac{1}{R}\frac{\partial R}{\partial T} \quad (6)$$

where $n_e$ and $n_o$ are extraordinary and ordinary refractive indices of the masterial for the extraordinary and ordinary waves in the birefringent masterial of the resonator, respectively, and R is the radius of the resonator. The free suspension condition is used here to exclude the thermally dependent strain of the resonator from consideration. Taking into account $(\partial n_o/\partial T)/n_o = 0.6$ ppm/K, $(\partial n_e/\partial T)=n_e=0.25$ ppm/K, and $(\partial R/\partial T)/R=9$ ppm/K, we find $\langle(\Delta\omega_0)^{1/2}\rangle \sim 27 \langle(\delta\omega_{RF})^{1/2}\rangle$ for a frequency corresponding to 1.5 μm wavelength light. The long term drift of the laser becomes only an order of magnitude larger than the long term drift of the master RF oscillator.

Figure 2:
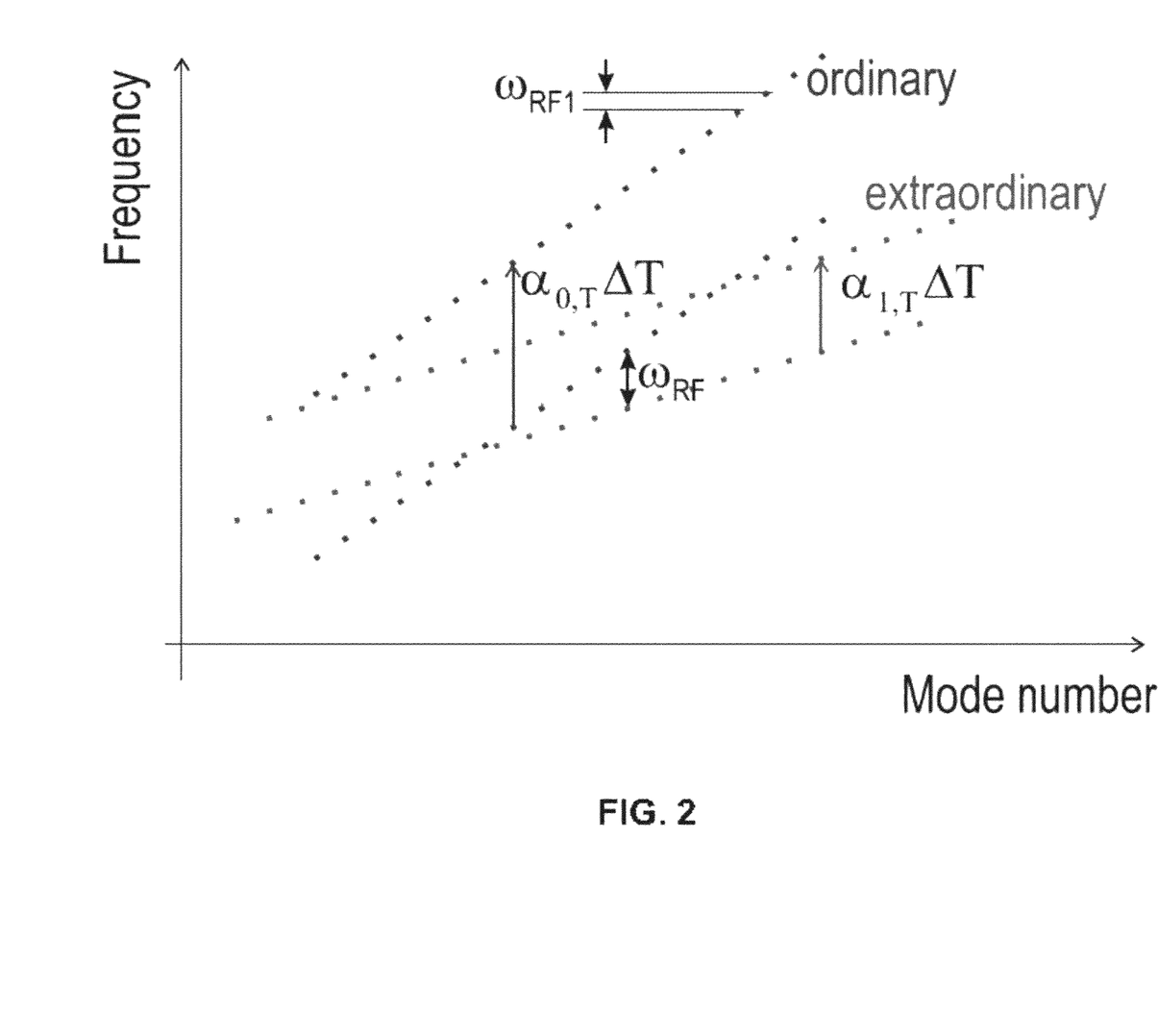
FIG. 2 shows an example of the thermal shift of the spectrum of a $MgF_2$ WGM microresonator for both the ordinary and extraordinary waves in terms of the mode number where the ordinary and extraordinary waves behave differently.

FIG. 2 shows an example of the thermal shift of the spectrum of a $MgF_2$ WGM microresonator for both the ordinary and extraordinary waves in terms of the mode number. The ordinary and extraordinary waves behave differently: if the temperature of the resonator changes by $\Delta T$, the ordinarily polarized mode frequencies shift by $\alpha_{0,T}\Delta T$, while extraordinarily polarized modes shift by $\alpha_{1,T}\Delta T$. To stabilize the frequency of the resonator spectrum, the present approach locks the frequency difference between one mode belonging to the family of the ordinarily polarized modes and the other mode belonging to the family of extraordinarily polarized modes to an RF master oscillator having frequency $\omega_{RF}$. This kind of locking not only stabilizes the entire optical spectrum but also enhances the relative stability of the frequency difference between any two optical modes belonging to the same mode family (e.g., $\omega_{RF1}$, as shown in the picture) beyond the stability of the master oscillator. The thermal shift of the FSRs is not shown, since it is small compared with the shift of the optical frequencies [see Eq. (8)].

The approach uses the optical resonator operates as a transformer of the stability of an RF master oscillator to the optical frequency domain. Notably, the transformation efficiency is large and the frequency drift of the optical modes exceeds $(\omega_0/\omega_{RF})\delta\omega_{RF}$.

The above example demonstrates that the proposed locking technique is efficient for suppression of the frequency drift associated with a single parameter $q_i$. If two independent drifting parameters are present (e.g., T and q) and temperature T is the parameter used in the feedback loop, Eqs. (2) and (4) suggest $$\Delta\omega_0 = \frac{\alpha_{0,T}}{\alpha_{0,T}-\alpha_{1,T}}\delta\omega_{RF} + \frac{\alpha_{0,T}\alpha_{1,q}-\alpha_{1,T}\alpha_{0,q}}{\alpha_{0,T}-\alpha_{1,T}}\Delta q. \quad (7)$$

where, for simplicity, $\delta\omega_0$ and $\delta\omega_1$ are neglected. The technique can suppress the drift of parameter q if it influences the resonator modes involved in the locking process such that $\alpha_{0,T}\alpha_{1,q} \approx \alpha_{1,T}\alpha_{0,q}$. Therefore, to cancel the drift of q, another locking loop can be implemented. For instance, if $\Delta T=\xi(\delta\omega_{RF}-\delta\omega_0+\delta\omega_1)/(\alpha_{0,T}-\alpha_{1,T})$ and $\Delta q=(1-\xi)(\delta\omega_{RF}-\delta\omega_0+\delta\omega_1)/(\alpha_{0,q}-\alpha_{1,q})$ can be reached with two different electronic feedback loops, where $1>\xi>0$, the complete stabilization of the optical frequency drift will be achieved again. The necessary condition is the asymmetry of the resonator response to the environmental or applied parameters $\alpha_{0,i}\neq\alpha_{1,i}$. It is possible to transfer the absolute stability of a master RF oscillator to a mode of an optical microresonator. The relative drift of the FSR and the optical frequencies belonging to the same mode family are the same:

$$\frac{\Delta\omega_{FSR}}{\omega_{FSR}} = \frac{\Delta\omega_0}{\omega_0}. \quad (8)$$

Therefore, with the stabilization procedure described above, the resonator FSR can be stabilized such that $$\frac{\Delta\omega_{FSR}}{\omega_{FSR}} = \frac{\alpha_{0,T}}{\alpha_{0,T}-\alpha_{1,T}}\frac{\delta\omega_{RF}}{\omega_{RF}}\frac{\omega_{RF}}{\omega_0}. \quad (9)$$

Hence, the long term stability of the FSR exceeds the stability of the master RF oscillator when the proposed stabilization procedure is used. In the particular case where the ordinarily and extraordinarily polarized resonator modes are used for locking, a stronger condition than Eq. (9) can be derived. For any pair of modes with the same polarization and at two different frequencies $\omega_1$ and $\omega_2$, the relative drift of the frequency difference $\omega_1-\omega_2=\omega_{RF1}$ is the same as the relative drift of the optical frequency. Selecting $\omega_{RF1}=\omega_{RF}$, stabilizing the optical resonator with an RF master oscillator produces two optical modes with a relative long term frequency stability much larger than the stability of the master oscillator:

$$\frac{\Delta\omega_{RF1}}{\omega_{RF1}} = \frac{\alpha_{0,T}}{\alpha_{0,T}-\alpha_{1,T}}\frac{\omega_{RF}}{\omega_0}\frac{\delta\omega_{RF}}{\omega_{RF}}. \quad (10)$$

Therefore, the slave oscillator can be locked to the corresponding pair of optical modes of the optical resonator to gain stability.

Let us consider a 10 MHz master oscillator characterized with Allan deviation of $10^{-7}$ at $10^3$ s. In accordance with Eq. (10), the optical resonator made with MgF2 allows us to achieve relative stability for two ordinary optical modes separated by 10 MHz at the level characterized by an Allan deviation of $1:4\times10^{-13}$ at $10^3$ s. This long term stability can be transferred to a slave RF oscillator locked to the optical modes with an optoelectronic feedback loop.

The above use two modes of two different mode families with different responses to external conditions is based on measuring the differences in the responses of the two different modes in the different families without directly measuring a particular parameter, e.g., measuring a change in the temperature of the resonator using the resonator modes themselves, without use of an external temperature sensor. The frequency difference between two WGMs having different thermorefractive coefficients should be compared with a relatively stable RF frequency and the resultant signal should be used for both temperature measurement and temperature compensation. One of the advantages of this technique is its ability to monitor the temperature of the material inside the WGM channel. External sensors show local temperatures and are unable to get such information.

Figure 3:
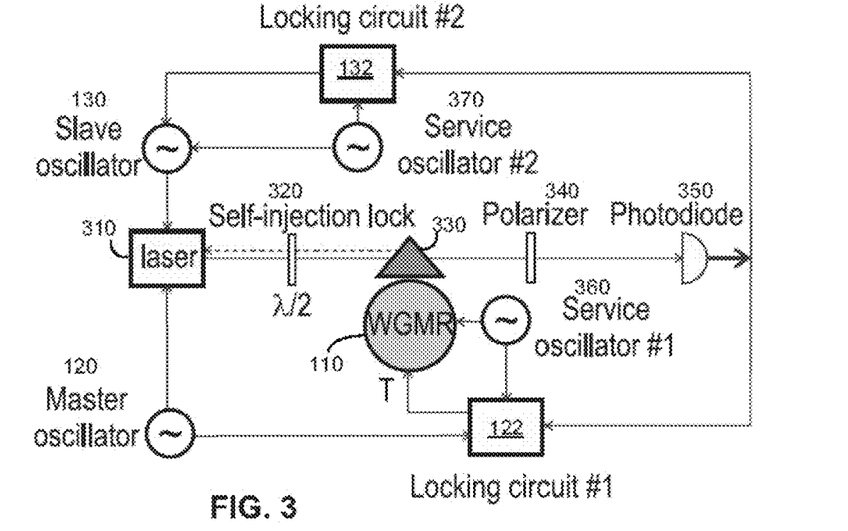
FIGS. 3 and 4 illustrate an implementation of the system in FIG. 1 and its operation based on two different families of TM and TE modes.

FIG. 3 shows an example of a system for stabilizing a slave RF oscillator with respect to an optical resonator. In this example, a laser 310 is provided to produce laser light at a carrier frequency. An optical resonator 110 is structured to support a first family of first optical modes and a second, different family of second optical modes where an optical mode in the first family and an optical mode in the second family exhibiting different susceptibilities to one or more external conditions of the optical resonator. The optical resonator 110 can include an optically birefringent material that supports ordinary and extraordinary optical waves in two different optical polarizations labeled as TE and TM polarizations. The optical resonator 110 is optically coupled via an optical coupler 330 to receive the laser light from the laser 310 and to support the laser light inside the optical resonator 110 at a selected first optical mode in the first family at a first optical frequency and a selected second optical mode in the second family at a second, different optical frequency. The frequency difference between the first optical frequency of the selected first optical mode and the selected second optical mode at the second optical frequency indicates a stability of the optical resonator 110 with respect to the one or more external conditions. A photodetector 350 is coupled to receive an optical signal from the optical resonator 110 that contains light in the selected first and second optical modes and produces a detector signal that represents a change in the frequency difference between the first optical frequency and the second optical frequency. The master RF oscillator 120 produces a stable master RF oscillation signal with a high stability. The slave RF oscillator 130 produces an RF oscillation signal and is the oscillator to be stabilized by this system. Two locking circuits 122 and 132 are provided in the system. The first locking circuit 122 is coupled between the master RF oscillator 120 and the optical resonator 110 and operable to control the optical resonator 110 to reduce the monitored change in the frequency difference between the first optical frequency and the second optical frequency and to stabilize the optical resonator 110 with respect to the master RF oscillator 120. The optical resonator 110 can be controlled to change its resonance frequency in a suitable manner, e.g., by controlling the pressure or force on the resonator 110, a temperature on the resonator, or a voltage applied to the resonator 110 (e.g., the resonator exhibits an opto-electric effect). The first locking circuit 122 receives the detector output and uses the information in the received detector output to control the optical resonator 110 in the locking operation. The second locking circuit 132 is coupled between the slave RF oscillator 130 and the optical resonator 110 and operable to control the slave RF oscillator 130 to stabilize the slave RF oscillator frequency relative to the optical resonator 110 so that the RF frequency of the slave RF oscillator 130 is stabilized with respect to the master RF oscillator 120 via the optical resonator 110.

In this example, the optical resonator 110 is shown as a WGM resonator made of a birefringent medium. The resonator 110 is interrogated by using a half-wave plate 320 to produce coherent laser light polarized 45° with respect to the polarizations of both the ordinary and extraordinary modes of the resonator 110. A polarizer 340 is placed between the optical coupler 330 and the photodetector 350.

The laser 310 can be locked to the optical resonator 110 via various techniques. As shown in FIG. 3, the light inside from the optical resonator 110 can be coupled out and be fed to the laser 310 to achieve injection locking of the laser 310 to a mode of the optical resonator 110. This injection locking can be achieved by coherent backscattering by the optical resonator 110 or coherent back reflection from the optical resonator 110. In addition, the laser 310 can be locked to the optical resonator 110 via a locking circuity, such as a Pound-Drever-Hall circuit. The locking the carrier frequency of the modulated laser light to the selected optical mode of the optical resonator 110 can be achieved by using a side-locking technique.

Figure 4:
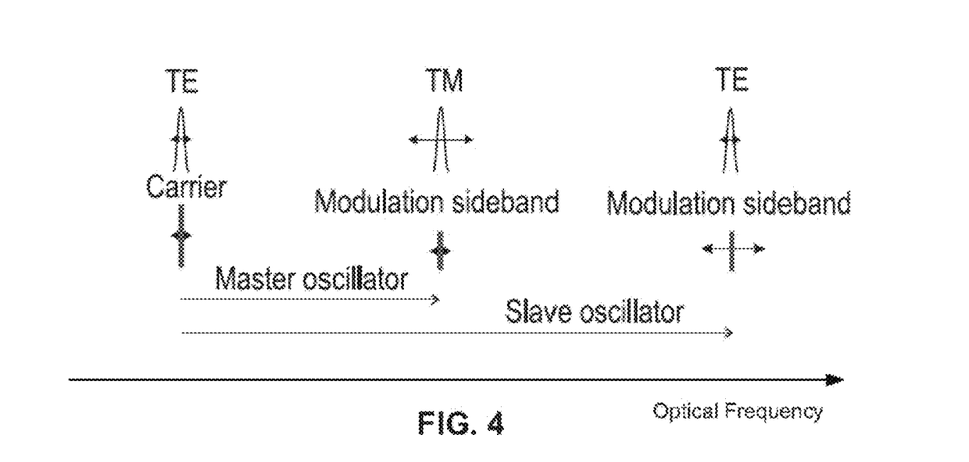

FIG. 4 shows the spectrum of the spectral components in the laser light confined in the optical resonator 110 in FIG. 3. The original laser light is shown in the TE mode and the two modulation sidebands are shown where the modulation sideband in the TM mode corresponds to the modulation sideband due to optical modulation at the master RF frequency while the modulation sideband in the TE mode corresponds to the modulation sideband due to optical modulation at the slave RF frequency.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, variations, enhancements and other implementations can be made based on what is described and illustrated in this document.

What is claimed is:
1. A method for stabilizing a radio frequency (RF) oscillator of interest via an optical resonator stabilized to a master RF oscillator, comprising:
providing an optical resonator that is structured to support a first family of first optical modes and a second, different family of second optical modes, an optical mode in the first family and an optical mode in the second family exhibiting different susceptibilities to one or more external conditions of the optical resonator;
selecting a first optical mode in the first family at a first optical frequency and a second optical mode in the second family at a second, different optical frequency to generate a frequency difference between the first optical frequency of the selected first optical mode and the selected second optical mode at the second optical fre- quency as an indicator of a stability of the optical resonator with respect to the one or more external conditions;

monitoring an optical signal from the optical resonator that represents a change in the frequency difference between the first optical frequency and the second optical frequency;

stabilizing the optical resonator to reduce the monitored change in the frequency difference between the first optical frequency and the second optical frequency to stabilize the optical resonator with respect to a master RF frequency from a master RF oscillator; and using information in the optical signal from the optical resonator to operate a locking circuit of an RF oscillator to lock an RF frequency of the RF oscillator of interest with respect to the optical resonator so that the RF oscillator of interest is stabilized relative to the master RF oscillator via the optical resonator.

2. The method as in claim 1, wherein:
the optical resonator exhibits optical birefringence and supports the first family of first optical modes in an ordinarily polarized mode and the second family of second optical modes in an extraordinarily polarized mode so that the selected first optical mode and the selected second optical mode experience different refractive indices and different responses to a change in temperature of the optical resonator.

3. The method as in claim 2, comprising:
using the frequency difference between the first optical frequency and the second optical frequency to monitor a change in temperature of the optical resonator without directly measuring the temperature of the optical resonator by using one or more temperature sensors.

4. The method as in claim 1, wherein the optical resonator is a monolithic resonator.

5. The method as in claim 1, wherein the optical resonator is a monolithic ring resonator.

6. The method as in claim 1, wherein:
the optical resonator is a whispering gallery mode resonator and the first family of first optical modes and the second family of second optical modes are whispering gallery modes.

7. The method as in claim 1, wherein the optical resonator is integrated on a planar semiconductor structure.

8. The method as in claim 1, comprising:
operating a laser to direct laser light into one mode of the optical resonator;
modulating the laser light inside the optical resonator to produce an optical harmonic to be coupled to the selected second optical mode of the optical resonator;
coupling the modulated light of the selected first optical mode and the selected second optical mode out of the optical resonator as the optical signal;
directing the optical signal into a photodetector to produce a detector signal containing information on the frequency difference; and
using the detector signal to lock the optical resonator to the master RF oscillator.

9. The method as in claim 8, comprising:
locking the laser to a selected optical mode of the optical resonator via optical feedback from the optical resonator to the laser.

10. The method as in claim 8, comprising:
locking the laser to the optical resonator via a Pound-Drever-Hall circuit.

11. The method as in claim 1, comprising:
in locking the RF oscillator of interest with respect to the optical resonator, selecting two optical modes at two different frequencies belonging to the same mode family from the first and second families to produce the information in the optical signal from the optical resonator by using a frequency difference between the two selected optical modes of the same family; and
using the frequency difference between the two selected optical modes of the same family as a frequency reference to lock the RF oscillator with respect to the optical resonator.

12. The method as in claim 1, wherein:
the one or more external conditions include a mechanical pressure applied to the optical resonator, a voltage applied to the optical resonator, or a temperature of a surrounding environment of the optical resonator.

13. A system for stabilizing a radio frequency (RF) oscillator of interest via an optical resonator locked to a master oscillator, comprising:
a laser that produces laser light;
an optical resonator that is structured to support a first family of first optical modes and a second, different family of second optical modes, an optical mode in the first family and an optical mode in the second family exhibiting different susceptibilities to one or more external conditions of the optical resonator, the optical resonator being optically coupled to receive the laser light from the laser and to support the laser light inside the optical resonator at a selected first optical mode in the first family at a first optical frequency and a selected second optical mode in the second family at a second, different optical frequency, wherein a frequency difference between the first optical frequency of the selected first optical mode and the selected second optical mode at the second optical frequency indicates a stability of the optical resonator with respect to the one or more external conditions;
a photodetector that is coupled to receive an optical signal from the optical resonator that contains light in the selected first and second optical modes and produces a detector signal that represents a change in the frequency difference between the first optical frequency and the second optical frequency;
a master oscillator that produces a stable master oscillation signal;
an RF oscillator that produces an RF oscillation signal;
a first locking circuit coupled between the master oscillator and the optical resonator and operable to control the optical resonator to reduce the monitored change in the frequency difference between the first optical frequency and the second optical frequency and to stabilize the optical resonator with respect to the master oscillator; and
a second locking circuit coupled between the RF oscillator and the optical resonator and operable to control the RF oscillator to stabilize the RF oscillator relative to the optical resonator to lock an RF frequency of the RF oscillator with respect to the master oscillator via the optical resonator.

14. The system as in claim 13, wherein:
the optical resonator exhibits optical birefringence and supports the first family of first optical modes in an ordinarily polarized mode and the second family of second optical modes in an extraordinarily polarized mode so that the selected first optical mode and the selected second optical mode experience different refractive indices and different responses to a change in temperature of the optical resonator.

15. The system as in claim 14, wherein:
the optical resonator is a whispering gallery mode resonator and the first family of first optical modes and the second family of second optical modes are whispering gallery modes.
16. The system as in claim 15, wherein the master oscillator is an RF oscillator, and the system comprises:
an optical modulation mechanism that causes optical modulation of the laser light coupled into the optical resonator based on the stable mater oscillation signal from the master oscillator.
17. The system as in claim 11, wherein:
the laser is locked to the optical resonator.
18. The system as in claim 13, wherein:
at least one of the first and second locking circuits is a Pound-Driver-Hall circuit.
19. The system as in claim 13, wherein:
the second locking circuit uses a frequency difference between two optical modes at two different frequencies of a same family from the first and second families as a frequency reference to lock the RF oscillator with respect to the optical resonator.
20. The system as in claim 13, wherein:
the one or more external conditions include a mechanical pressure applied to the optical resonator, a voltage applied to the optical resonator, or a temperature of a surrounding environment of the optical resonator.
21. The system as in claim 13, wherein:
the master oscillator is an optical oscillator.
22. The system as in claim 13, wherein:
the master oscillator is an RF oscillator that includes one or more opto-electronic oscillation loops.
23. A system for stabilizing a radio frequency (RF) oscillator with respect to an optical resonator, comprising:
a laser that produces laser light;
an optical resonator that is an optical whispering gallery mode resonator supporting a first family of first optical modes and a second, different family of second optical modes, wherein the optical resonator is structured so that an optical mode in the first family and an optical mode in the second family exhibit different susceptibilities to one or more external conditions of the optical resonator;
an optical coupler that couples the laser light into the optical resonator so the laser light inside the optical resonator is at a selected first optical mode in the first family at a first optical frequency and a selected second optical mode in the second family at a second, different optical frequency, wherein a frequency difference between the first optical frequency of the selected first optical mode and the selected second optical mode at the second optical frequency indicates a stability of the optical resonator with respect to the one or more external conditions;
a photodetector that is coupled to receive an optical signal from the optical resonator that contains light in the selected first and second optical modes and produces a detector signal that represents a change in the frequency difference between the first optical frequency and the second optical frequency;
a master RF oscillator that produces a stable master RF oscillation signal which is coupled to cause a first optical modulation in the laser light inside the optical resonator;
a first locking circuit coupled to receive the RF oscillation signal from the master RF oscillator and the detector signal from the photodetector and operable to control the optical resonator, based on the first optical modulation, to reduce the monitored change in the frequency difference between the first optical frequency and the second optical frequency and to stabilize the optical resonator with respect to the master RF oscillator;
an RF oscillator that produces an RF oscillation signal which is coupled to cause a second optical modulation in the laser light inside the optical resonator; and
a second locking circuit coupled between the RF oscillator and the optical resonator and operable to control, based on the second optical modulation, the RF oscillator to stabilize the RF oscillator relative to the optical resonator.
24. The system as in claim 23, wherein:
the laser is locked in frequency to an optical mode of the optical resonator.
25. The system as in claim 23, wherein:
the optical resonator is structured so that two different optical modes in the same family of optical modes and exhibit similar or the same susceptibilities to one or more external conditions of the optical resonator; and
the second locking circuit is configured to use a frequency difference between the two different optical modes of the same family to stabilize the RF oscillator relative to the optical resonator.

* * * * *